(12) United States Patent
Kuroda et al.

(10) Patent No.: US 8,466,041 B2
(45) Date of Patent: Jun. 18, 2013

(54) METHOD FOR MANUFACTURING LAMINATION TYPE SEMICONDUCTOR INTEGRATED DEVICE

(75) Inventors: Yasuyoshi Kuroda, Annaka (JP); Kazunori Kondo, Annaka (JP); Hideto Kato, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 99 days.

(21) Appl. No.: 12/950,308

(22) Filed: Nov. 19, 2010

(65) Prior Publication Data

US 2011/0136321 A1    Jun. 9, 2011

(30) Foreign Application Priority Data

Dec. 3, 2009    (JP) ................. 2009-275190

(51) Int. Cl.
*H01L 21/762*    (2006.01)
(52) U.S. Cl.
USPC .................... 438/459; 257/E21.568
(58) Field of Classification Search
None
See application file for complete search history.

(56) References Cited

U.S. PATENT DOCUMENTS

2003/0064579 A1    4/2003    Miyakawa et al.

FOREIGN PATENT DOCUMENTS

| JP | A-2003-203886 | 7/2003 |
|----|---------------|--------|
| JP | A-2004-26950  | 1/2004 |
| JP | B2-3740451    | 11/2005 |
| JP | A-2008-162240 | 7/2008 |
| JP | A-2009-132867 | 6/2009 |

OTHER PUBLICATIONS

Japanese Office Action dated Jan. 17, 2012 in Japanese Patent Application No. 2009-275190 (with partial translation).

*Primary Examiner* — Seahvosh Nikmanesh
(74) *Attorney, Agent, or Firm* — Oliff & Berridge, PLC

(57) ABSTRACT

Provided is a method for manufacturing a lamination type semiconductor integrated device that can simultaneously attain grinding force resistance during back side grinding of a semiconductor wafer, heat resistance during anisotropic dry etching and the like, chemical resistance during plating and etching, smooth debonding of a support substrate for processing at the end, and low adherend staining; the method comprises at least a step of back side grinding of a first semiconductor wafer having a device formed on its surface and a step of laminating by electrical bonding the first semiconductor wafer with a second semiconductor wafer having a device formed on its surface, wherein, at the time of back side grinding of the first semiconductor wafer, back of the first semiconductor wafer is ground after surface of formed device on the first semiconductor wafer is bonded to a support substrate for processing by using a pressure-sensitive silicone adhesive.

25 Claims, 2 Drawing Sheets

(a)

3
2
1

(b) BACK SIDE GRINDING

FORMATION OF THROUGH ELECTRODE (c)

4

(d) FORMATION OF METAL BUMP

5

LAMINATING (e)

6

(f) DEBONDING

METHOD FOR MANUFACTURING LAMINATION TYPE SEMICONDUCTOR INTEGRATED DEVICE

BACKGROUND OF THE INVENTION

1. Field of the Invention

The present invention relates to a method for manufacturing a lamination type semiconductor integrated device, in particular to a method for manufacturing a lamination type semiconductor integrated device in a wafer level using a TSV (Through Silicon Via) technology.

2. Description of the Related Art

A semiconductor integrated device is used in large quantity for industrial goods and so on. However, due to increasing speed of a device and miniaturization of a mounting device, further minuter packaging area, higher integration, and further reduction of wiring resistance in view of distance reduction among wirings is required.

In order to realize further minuter packaging area, higher integration, and distance reduction among wirings, an investigation is being carried out to integrate a plurality of packages into one package in a semiconductor integrated device and the result has been practically used.

In the past, after chopped into individual chips, they were packaged by an epoxy resin or the like; in this way a semiconductor integrated device has been provided. In recent years, because of reduction of packaging area and increase of operation speed, such methods as a PoP (Package on Package) which involves further packaging of packaged semiconductor integrated devices and a W/B method which involves bonding of chipped semiconductor integrated devices by wire bonding as they are in the chip form have been developed.

In recent years, to further increase action speed, miniaturize, reduce packaging area, and reduce wiring resistance, a so-called lamination type semiconductor integrated device formed of a lamination of a semiconductor integrated device with a different semiconductor integrated device, not by using wire bonding, has been developed. Currently, a lamination type semiconductor integrated device is being made by a method in which semiconductor integrated devices chopped into individual chips are laminated (Chip-on-Chip, or CoC) or a method in which individually chopped semiconductor integrated devices are laminated while keeping the form of a semiconductor wafer only in the lowest layer (Chip-on-Wafer, or CoW).

CoC and CoW have a high possibility of producing a product without defect, because a semiconductor integrated device chip without defect can be selected individually and a lamination type semiconductor integrated device is produced after laminating these chips without defect; on the other hand, CoC and CoW have such problems that: position accuracy at the time of laminating is necessary in each of semiconductor integrated devices because of miniaturization of the chip size and mass production is difficult because each chip is laminated sequentially.

In view of the above-mentioned, as a method for manufacturing laminated semiconductor integrated device in lower cost and larger quantity, it has been proposed a lamination type semiconductor integrated device wherein each semiconductor integrated device formed on a semiconductor wafer are laminated all at once by electrical bonding in the state of a semiconductor wafer without chopping. This semiconductor integrated device has a merit that the semiconductor integrated devices are bonded electrically in the vertical direction thereby enabling to reduce wiring resistance and packaging area, in addition, it can easily realize position accuracy and laminating can be done all at once.

One example of the production method is that after a semiconductor integrated device is formed on a semiconductor wafer, another support substrate for processing is bonded on surface of the semiconductor integrated device and then the semiconductor wafer is made thin by back side grinding, etching, and the like. Then, after a deep through hole having large aspect ratio is formed by using a technology such as anisotropic dry etching (a TSV technology: Trough Silicon Via technology), an insulator film is made in the through hole, which is then buried with an electric conductive material such as copper by plating or the like. The back of this semiconductor wafer is bonded by electrical bonding with surface of semiconductor wafer formed with another semiconductor integrated device, and then the support substrate for processing is debonded. These steps are executed sequentially thereby obtaining a lamination type semiconductor integrated device having a plurality of lamination layers of the semiconductor integrated device in the state of semiconductor wafer, that is, a Wafer-on-Wafer (WoW) method is exemplified.

In the foregoing method, a pressure-sensitive adhesive used to bond a support substrate for processing with surface of a semiconductor wafer having a formed semiconductor integrated device is required to simultaneously have, from grinding of the semiconductor wafer to debonding of the support substrate for processing after electrically bonding two semiconductor wafers arranged one above the other, grinding force resistance during back side grinding, small grinding striation, heat resistance in anisotropic dry etching during formation of a through hole, chemical resistance during plating and wet etching to remove grinding striation and to form a through hole, smooth debonding of the support substrate for processing at the end, low adherend staining, and the like.

To bond a support substrate for processing, a pressure-sensitive acryl adhesive or rubber adhesive has been used in the past. However, these adhesives are weak to heat, thereby leading to cause a problem that they are melted during heating process in the step of laminating by electrical bonding as mentioned above.

Alternatively, in the Japanese Patent Publication Number 3740451, a protection film for a semiconductor surface is proposed; this considers a thinning process such as back side grinding and etching, but does not mention at all about a behavior under heating condition especially such as exposing to 150° C. or higher for one hour or longer.

As mentioned above, there have been no methods for manufacturing a lamination type semiconductor integrated device that can simultaneously satisfy grinding force resistance during back side grinding of a semiconductor wafer, heat resistance during anisotropic dry etching and the like, chemical resistance during plating and etching, smooth debonding of a support substrate for processing at the end, and low adherend staining; and thus a lamination type semiconductor integrated device so far having been put to practical use by using a TSV technology is only in a mounting image sensor, which does not require debonding of a glass substrate, a support substrate for processing, at the end.

SUMMARY OF THE INVENTION

The present invention was made in view of the above-mentioned problems, and has an object to provide a method for manufacturing a lamination type semiconductor integrated device that can simultaneously satisfy grinding force resistance during back side grinding of a semiconductor wafer, heat resistance during anisotropic dry etching and the like, chemical resistance during plating and etching, smooth debonding of a support substrate for processing at the end, and low adherend staining.

In order to solve the problems as mentioned above, the present invention provides a method for manufacturing a lamination type semiconductor integrated device, the method comprising at least a step of back side grinding of a first semiconductor wafer having a device formed on its surface and a step of laminating by electrical bonding the first semiconductor wafer with a second semiconductor wafer having a device formed on its surface, wherein, at the time of back side grinding of the first semiconductor wafer, back of the first semiconductor wafer is ground after surface of formed device on the first semiconductor wafer is bonded to a support substrate for processing by using a pressure-sensitive silicone adhesive.

As mentioned above, at the time of back side grinding of a first semiconductor wafer, if back of the first semiconductor wafer is ground after surface of formed device on the first semiconductor wafer is bonded to a support substrate for processing by using a pressure-sensitive silicone adhesive, it can endure the resistance during back side grinding and is excellent in heat resistance, chemical resistance, and low adherend staining; and thus the adhesive is suitably usable in laminating by electrical bonding with a second semiconductor wafer having a device formed on its surface.

In this case, it is preferable that bonding be done by using a pressure-sensitive silicone adhesive having adhesion strength in the range from 0.02 to 0.20 N/25-mm at room temperature and adhesion strength of 0.20 N/25-mm or less after heating process in the step of laminating by electrical bonding.

Alternatively, it is preferable that bonding be done by using a pressure-sensitive silicone adhesive having adhesion strength in the range from 0.02 to 0.20 N/25-mm at room temperature, adhesion strength of 1.00 N/25-mm or less after heating process in the step of laminating by electrical bonding, and adhesion strength of 0.20 N/25-mm or less during re-heating at 70 to 200° C.

If bonding between surface of formed device on a first semiconductor wafer and a support substrate for processing is done by using a pressure-sensitive silicone adhesive having adhesion strength in the range from 0.02 to 0.20 N/25-mm at room temperature and adhesion strength of 0.20 N/25-mm or less after heating process in the step of laminating by electrical bonding, or by using a pressure-sensitive silicone adhesive having adhesion strength in the range from 0.02 to 0.20 N/25-mm at room temperature, adhesion strength of 1.00 N/25-mm or less after heating process in the step of laminating by electrical bonding, and adhesion strength of 0.20 N/25-mm or less during re-heating at 70 to 200° C., adhesion strength enduring grinding force at the time of back side grinding can be obtained while debonding of the support substrate for processing from the semiconductor wafer after heating process can be executed easily.

For this, a pressure-sensitive silicone adhesive, comprising:

(A) 30 to 70 parts by mass of a diorganopolysiloxane containing 2 or more of an alkenyl group in a molecule and having viscosity of 10,000 mPa·s or more at 25° C.,
(B) 70 to 30 parts by mass of a polyorganosiloxane containing a $R^1_3SiO_{0.5}$ unit and an $SiO_2$ unit with the mole ratio $R^1_3SiO_{0.5}/SiO_2$ being in the range from 0.5 to 1.7 ($R^1$ independently represents a substituted or a unsubstituted monovalent hydrocarbon group having 1 to 10 carbon atoms), wherein the sum of Components (A) and (B) is 100 parts by mass,
(C) an organohydrogen polysiloxane containing 2 or more of an SiH group in a molecule with the mole ratio of the SiH group in Component (C) to the alkenyl group in Component (A) being in the range from 0.5 to 20,
(D) 0 to 8.0 parts by mass of a reaction controlling agent relative to 100 parts by mass of the sum of Components (A), (B), and (C), and
(E) an effective amount of a Pt catalyst, can be used.

In this case, Component (A) can be made to a diorganopolysiloxane represented by any one of the following general formula (1) and formula (2) or both:

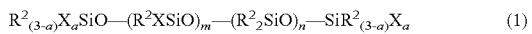

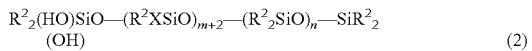

(Wherein, each $R^2$ independently represents a monovalent hydrocarbon group not containing an aliphatic unsaturated bond; each X independently represents an alkenyl-containing monovalent organic group; character "a" represents an integer of 0 to 3; 2a+m indicates a number giving content of an alkenyl group in the range from 0.75 to 7.5% by mole in a molecule; character "n" represents a number of 100 or more; and m+n indicates a number giving a polydiorganosiloxane represented by any one of the general formula (1) and formula (2) or both having viscosity of 10,000 mPa·s or more at 25° C.)

As shown above, when the pressure-sensitive silicone adhesive containing Components (A) to (E), especially wherein Component (A) is represented by any one of the general formula (1) and formula (2) or both, is used, adhesion strength endurable grinding force at the time of back side grinding of a first semiconductor wafer can be obtained while debonding of a support substrate for processing from a first semiconductor wafer can be executed easily.

In addition, the pressure-sensitive silicone adhesive is in a form of liquid; after the adhesive is applied onto any one of the support substrate for processing and surface of formed device on the first semiconductor wafer or both and then cured, the support substrate for processing can be bonded to surface of formed device on the first semiconductor wafer.

As mentioned above, if the pressure-sensitive silicone adhesive in a liquid form is used, a uniform adhesive layer to bond the support substrate for processing with the first semiconductor wafer can be formed easily.

Alternatively, the pressure-sensitive silicone adhesive in a form of a pressure-sensitive silicone adhesive double coated tape can be used.

If a pressure-sensitive silicone adhesive in a form of pressure-sensitive silicone adhesive double coated tape is used, the adhesive tape itself can be prepared easily; in addition, its handling is easy, and a wafer laminator generally used in a semiconductor manufacturing process can be used at the time of bonding a first semiconductor wafer with a support substrate for processing; and thus it is economical.

In this case, the pressure-sensitive silicone adhesive double coated tape having a heat resistant plastic film as a support substrate coated with the pressure-sensitive silicone adhesive on the both sides can be used.

As mentioned above, if a pressure-sensitive silicone adhesive double coated tape having a heat resistant plastic film as a support substrate is used, heating can be executed without problems even if heating above 150° C. is continued more than one hour during such as anisotropic dry etching at the time of producing a through electrode.

In this case, it is preferable that adhesive strength of the pressure-sensitive silicone adhesive double coated tape be higher in the adhesion side to the support substrate for processing than in the adhesion side to surface of formed device on the first semiconductor wafer.

As mentioned above, if the pressure-sensitive silicone adhesive double coated tape having higher adhesion strength in the adhesion side to the support substrate for processing than in the adhesion side to surface of formed device on the first semiconductor wafer is used, the pressure-sensitive silicone adhesive tape can be released more surely from the semiconductor wafer surface at the time of debonding of the support substrate for processing from the semiconductor wafer.

In addition, it is preferable that size of the pressure-sensitive silicone adhesive double coated tape be larger than, partly or totally, the support substrate for processing and the first semiconductor wafer to be bonded.

As mentioned above, if size of the pressure-sensitive silicone adhesive double coated tape is larger than, partly or totally, that of the support substrate for processing and the first semiconductor wafer to be bonded, the pressure-sensitive adhesive tape can be easily released by using this large portion as the supporting point; thus it is convenient.

As mentioned above, by using a method for manufacturing a lamination type semiconductor integrated device of the present invention, grinding force resistance during back side grinding of a semiconductor wafer, heat resistance in a step of anisotropic dry etching and the like, chemical resistance during plating and etching, smooth debonding of a support substrate for processing at the end, and low adherend staining can be attained simultaneously.

DESCRIPTION OF THE PREFERRED EMBODIMENTS

Hereinafter, the present invention will be explained more detail.

As mentioned above, in a method for manufacturing a lamination type semiconductor integrated device, in particular in a method for manufacturing a lamination type semiconductor integrated device using a TSV (Through Silicon Via) technology, a method enabling to simultaneously accomplish grinding force resistance during back side grinding of a semiconductor wafer, heat resistance in a step of anisotropic dry etching and the like, chemical resistance during plating and etching, smooth debonding of a support substrate for processing at the end, and low adherend staining has been sought.

Inventors of the present invention carried out an extensive investigation and keen examination to achieve the object as described above, and as a result, the inventors made an invention on a method for manufacturing a lamination type semiconductor integrated device satisfying each of the foregoing properties by executing a later-described process for manufacturing a lamination type semiconductor integrated device by using a pressure-sensitive silicone adhesive.

That is, a method for manufacturing a lamination type semiconductor integrated device of the present invention is the method comprising at least a step of back side grinding of a first semiconductor wafer having a device formed on its surface and a step of laminating by electrical bonding the first semiconductor wafer with a second semiconductor wafer having a device formed on its surface, wherein, at the time of back side grinding of the first semiconductor wafer, back of the first semiconductor wafer is ground after surface of formed device on the first semiconductor wafer is bonded to a support substrate for processing by using a pressure-sensitive silicone adhesive.

Hereinafter, embodiments of the present invention will be explained more specifically by exemplifying the manufacturing process with reference to the Figures; but the present invention is not limited to them.

Figure 1:
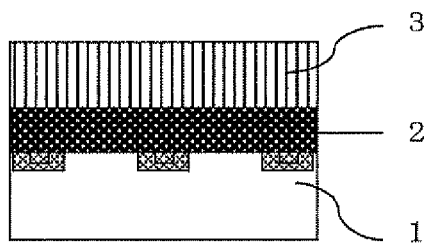
FIG. 1 is a schematic drawing illustrating an example of the method for manufacturing a lamination type semiconductor integrated device according to the present invention.
Figure 1:
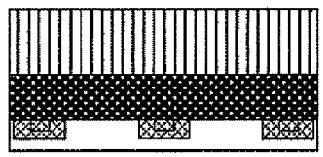
Figure 1:
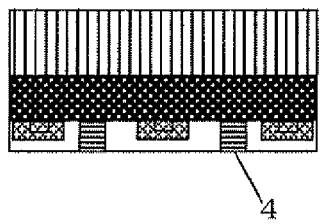
Figure 1:
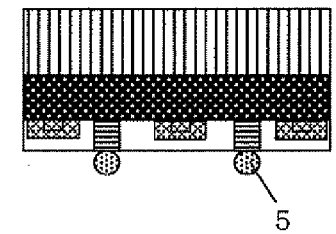
Figure 1:
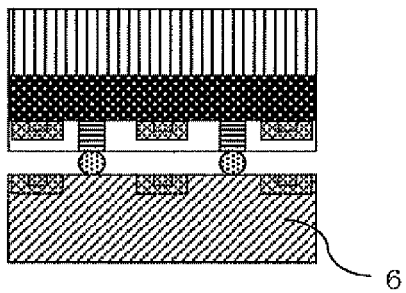
Figure 1:
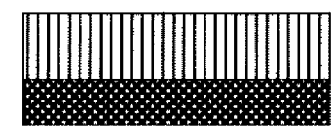
Figure 1:
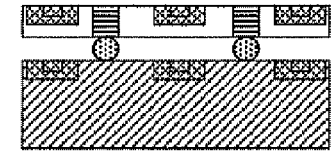

FIG. 1 is a schematic drawing illustrating an example of the method for manufacturing a lamination type semiconductor integrated device according to the present invention.

In the present invention, for example, as shown in FIG. 1(a), a first semiconductor wafer 1 having a device formed on its surface is bonded to a support substrate for processing 3 via a pressure-sensitive silicone adhesive 2. Then, a series of steps, such as a step of back side grinding of the first semiconductor wafer 1 (FIG. 1(b)), a step of forming a through electrode 4 (FIG. 1(c)) by plating to obtain an electrode such as a copper after formation of a through hole as a step for laminating by electrical bonding, and a step of forming a metal bump 5 for electrical bonding (FIG. 1(d)), are executed; thereafter the first semiconductor wafer 1 and a second semiconductor wafer 6 are laminated by electrical bonding (FIG. 1(e)), and then the support substrate for processing 3 is debonded from surface of the first semiconductor wafer 1 together with the pressure-sensitive silicone adhesive 2 (FIG. 1(f)). Thereafter, the steps of (a) to (f) are repeated to manufacture a lamination type semiconductor integrated device.

As mentioned above, it is preferable that the support substrate for processing be debonded from the back-side-ground first semiconductor wafer after the second semiconductor wafer is electrically bonded. The first semiconductor wafer after back side grinding is thin with the thickness of 30 to 200 µm so that it is easily breakable by stress at the time of debonding; and thus if the second semiconductor wafer is bonded, it can be reinforced so as to endure the stress at the time of debonding.

In the present invention, it is preferable that the pressure-sensitive silicone adhesive 2 to be used for bonding have the following properties.

The pressure-sensitive silicone adhesive having larger adhesion strength than any one of grinding force and polishing resistance or both at the time of thinning of the first semiconductor wafer by grinding, polishing, and the like from its back side is preferably used.

If the adhesion strength is larger than any one of grinding force and polishing resistance or both at the time of thinning, it can endure the load applied by rotation of a grinding stone and/or a polishing pad; and thus a semiconductor wafer does not rotate, thereby enabling to execute uniform grinding and/or polishing without fears of debonding of the semiconductor wafer from the support substrate for processing and damage caused thereby.

Further, it is preferable that the pressure-sensitive silicone adhesive 2 do not dissolve into a chemical used in its process. The chemical to be used in the process include a cleaning agent used for various semiconductor wafers, a plating liquid used for plating for wiring of copper, tin, or the like, a resist solution, and a resist-removing liquid; but the chemical is not limited to them. Any of an organic solvent having high polarity and an aqueous inorganic solution can be used except for an organic solvent dissolvable the pressure-sensitive silicone adhesive, such as a paraffin, an isoparaffin, and an aromatic solvent such as toluene and xylene.

The pressure-sensitive silicone adhesive is characterized in that amount of remaining stain—derived from the silicone adhesive attached to the semiconductor integrated device after the silicone adhesive is removed by using, for example, an organic solvent or after the silicone adhesive in a tape form is released—is small. Because silicone can become a factor of contact fault, it is not desirable to remain on the semiconductor integrated device. However, according to the present invention, silicone stain becomes a minimum; and thus possibility to cause contact fault is extremely low. In addition, silicone stain is not in a charred state of the silicone adhesive itself on the semiconductor wafer, but is merely attached; thus the silicone residue can be easily removed by cleaning with a silicone-dissolvable solvent such as an aromatic solvent such as toluene and xylene, an aliphatic solvent such as hexane, octane, and isoparaffin, a ketonic solvent such as methyl ethyl ketone and methyl isobutyl ketone, an ester solvent such as ethyl acetate and isobutyl acetate, and mixture of them.

Further, when a heating process is executed in the step of laminating by electrical bonding a first semiconductor wafer with a second semiconductor wafer having a device formed on its surface, it is preferable that adhesion strength of the pressure-sensitive silicone adhesive do not change before and after the heating process or be lower after the heating process than before the heating process.

As mentioned above, if the adhesive strength does not change before and after the heating process or the adhesion strength after the heating process is lower than before the heating process, debonding of the support substrate for processing from the semiconductor wafer can be made easier thereby eliminating a fear of damaging the semiconductor wafer.

It must be noted here that the heating process include such as heating by anisotropic dry etching at the time of through electrode formation of the first semiconductor integrated device, and heating by solder reflow to an electrode.

As the pressure-sensitive silicone adhesive, specifically the adhesive having the adhesion strength at room temperature in the range from 0.02 to 0.20 N/25-mm, preferably in the range from 0.04 to 0.10 N/25-mm, and more preferably in the range from 0.05 to 0.10 N/25-mm, with the adhesion strength after the heating process in the step of laminating by electrical bonding being 0.20 N/25-mm or less, is preferably used.

In the case of silicon wafer, although depending on diameter of the semiconductor wafer, when the entire surface of silicon wafer having diameter of 300 nm is bonded, adhesion strength of 0.02 N/25-mm or more can endure grinding and polishing resistance during thinning process of the silicon wafer and can firmly fix the silicon wafer without rotation. As a result, thinning can be done uniformly and the semiconductor integrated device thus manufactured becomes excellent. If the adhesion strength is 0.20 N/25-mm or less, bonding may be done again if some troubles occur in uniformity such as engulfing of air bubbles at the time of bonding before the thinning process. In addition, there is such a merit that debonding can be done easily at the time when the support substrate for processing is debonded from the semiconductor wafer.

Alternatively, when a heating process is done during manufacturing of a semiconductor integrated device, adhesion strength of the pressure-sensitive silicone adhesive after the heating process may be made to heavier release compared to the adhesion strength before the heating process, but in this case, it is preferable to make it lighter release at high temperature by heating again for debonding.

As the pressure-sensitive silicone adhesive like this, specifically the adhesive having the adhesion strength at room temperature in the range from 0.02 to 0.20 N/25-mm, 1.00 N/25-mm or less after the heating process in the step of laminating by electrical bonding, and 0.20 N/25 mm or less during re-heating at 70 to 200° C. is preferably used.

Especially the adhesive having adhesion strength in the range from 0.005 to 0.20 N/25-mm during re-heating at 70° C. or higher is preferable; or adhesion strength in the range from 0.005 to 0.05 N/25-mm is more preferable. If the adhesion strength is 0.005 N/25-mm or more, a semiconductor wafer can be held during heating; and if the adhesion strength is 0.20 N/25-mm or less, debonding can be done easily during re-heating.

The heating temperature to release the silicone adhesive is preferably below the temperature used in dry etching process, solder reflow process, and so on. Specifically temperature of 200° C. or lower, preferably 180° C. or lower, and more preferably 150° C. or lower is used. If the temperature is 200° C. or lower, a trouble such as unintended circuit shortening by re-melting of solder at the time of thermal release does not occur because the temperature is below the solder reflow temperature.

As the pressure-sensitive silicone adhesive like this having low adhesion strength at room temperature (initial adhesion strength) and further lower adhesion strength during heating, an addition-cure type pressure-sensitive silicone adhesive which is also advantageous in re-bonding is preferably used.

As the addition-cure type pressure-sensitive silicone adhesive, a pressure-sensitive silicone adhesive comprising:

(A) 30 to 70 parts by mass of a diorganopolysiloxane containing 2 or more of an alkenyl group in a molecule and having viscosity of 10,000 mPa·s or more at 25° C., (B) 70 to 30 parts by mass of a polyorganosiloxane containing a $R^1_3SiO_{0.5}$ unit and an $SiO_2$ unit with the mole ratio of $R^1_3SiO_{0.5}/SiO_2$ being in the range from 0.5 to 1.7 ($R^1$ independently represents a monovalent hydrocarbon group having 1 to 10 carbon atoms), wherein the sum of Components (A) and (B) is 100 parts by mass, (C) an organohydrogen polysiloxane containing 2 or more of an SiH group in a molecule with the mole ratio of the SiH group in Component (C) to the alkenyl group in Component (A) being in the range from 0.5 to 20, (D) 0 to 8.0 parts by mass of a reaction controlling agent relative to 100 parts by mass of the sum of Components (A), (B), and (C), and (E) an effective amount a Pt catalyst, is preferably used.

Hereinafter, each Component will be explained in detail.

<Component (A)>

Component (A) is a linear or a branched diorganopolysiloxane containing two or more of alkenyl groups in a molecule; in particular diorganopolysiloxane containing alkenyl groups in the range from 0.75 to 7.5% by mole (mole number of alkenyl group/mole number of Si) in a molecule is preferable.

As the specific diorganopolysiloxane like this, those represented by any one of the following formula (1) and formula (2) or both can be mentioned.

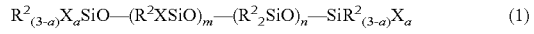

$$R^2_{(3-a)}X_aSiO-(R^2XSiO)_m-(R^2_2SiO)_n-SiR^2_{(3-a)}X_a \quad (1)$$

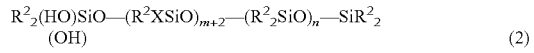

$$R^2_2(HO)SiO-(R^2XSiO)_{m+2}-(R^2_2SiO)_n-SiR^2_2(OH) \quad (2)$$

(Wherein, each $R^2$ independently represents a monovalent hydrocarbon group not containing an aliphatic unsaturated bond; each X independently represents an alkenyl-containing monovalent organic group; character "a" represents an integer of 0 to 3; 2a+m indicates a number giving content of an alkenyl group in the range from 0.75 to 7.5% by mole in a molecule; character "n" represents a number of 100 or more; and m+n indicates a number giving a polydiorganosiloxane represented by any one of the general formula (1) and formula (2) or both having viscosity of 10,000 mPa·s or more at 25° C., preferably 50,000 mPa·s or more, and more preferably 100,000 mPa·s or more.)

In the foregoing formulae, $R^2$ is preferably a monovalent hydrocarbon group having 1 to 10 carbon atoms such as an alkyl group such as a methyl group, an ethyl group, a propyl group, and a butyl group; a cycloalkyl group such as a cyclohexyl group; and an aryl group such as a phenyl group and a tolyl group; in particular, an alkyl group such as a methyl group or a phenyl group is preferable.

The alkenyl-containing monovalent organic group X is preferably an organic group having 2 to 10 carbon atoms including an alkenyl group such as a vinyl group, an allyl group, a hexenyl group, and an octenyl group; a (meth)acryloyl alkyl group such as an acryloyl propyl group, an acryloyl methyl group, and a methacryloyl propyl group; a (meth)acryloxy alkyl group such as an acryloxy propyl group, an acryloxy methyl group, a methacryloxy propyl group, and a methacryloxy methyl group; and an alkenyl-containing monovalent hydrocarbon group such as cyclohexenyl ethyl group and a vinyloxy propyl group; in particular, a vinyl group is preferable in the industry view point.

In the general formula (1), character "a" represents an integer of 0 to 3. If character "a" is in the range from 1 to 3, terminal of the molecular chain is blocked by an alkenyl group thereby enabling to complete the reaction in short time because of this highly reactive alkenyl group at the molecular chain terminal; and thus it is preferable. Further, in terms of economy, a=1 is preferable in the industry view point.

Form of the alkenyl-containing diorganopolysiloxane is preferably oil-like or gum-like.

The alkenyl-containing diorganopolysiloxane may be a linear chain or a branched chain.

Viscosity of Component (A) at 25° C. is preferably, if it is oil-like, 10,000 mPa·s or more, in particular 50,000 mPa·s or more. When the viscosity is 10,000 mPa·s or more, crosslinking of a cured material does not take place thereby enabling to keep its flexibility; and as a result, suitable adhesion strength can be obtained. If it is gum-like, there is no specific upper limit in viscosity (usually viscosity at 25° C. is 100,000 mPa·s or more, in particular 500,000 mPa·s or more); but, for example, viscosity in toluene solution with concentration of 30% is preferably 100,000 mPa·s or less. When the viscosity is 100,000 mPa·s or less, viscosity of the composition becomes suitable thereby enabling to agitate easily at the time of manufacturing.

Two or more kinds of Component (A) may be used simultaneously.

Amount of the alkenyl group in the alkenyl-containing diorganopolysiloxane of Component (A) is preferably in the range from 0.75 to 7.5% by mole, more preferably in the range from 1.5 to 5% by mole, and still more preferably in the range from 1.5 to 4% by mole.

When amount of the alkenyl group is 0.75% by mole or more, adhesion strength is not too high; and thus release can be done easily. When amount of the alkenyl group is 7.5% by mole or less, appropriate cure is obtained; and thus suitable adhesion strength can be obtained.

The alkenyl group of the alkenyl-containing diorganopolysiloxane may be located either at a molecular chain terminal or only inside a molecular chain; but it is more preferable that a molecular chain terminal be blocked by the alkenyl group. The alkenyl group located at a molecular chain terminal has high reactivity thereby enabling to complete a reaction in short time.

<Component (B)>

Component (B) is a polyorganosiloxane containing a $R^1_3SiO_{0.5}$ unit (wherein, $R^1$ independently represents an unsubstituted or a substituted monovalent hydrocarbon group having 1 to 10 carbon atoms) and an $SiO_2$ unit with the mole ratio of $R^1_3SiO_{0.5}/SiO_2$ being in the range from 0.5 to 1.7, and preferably in the range from 0.6 to 1.2.

A representative example of Component (B) is substantially comprised of only a $R^1_3SiO_{0.5}$ unit and an $SiO_2$ unit. When the mole ratio $R^1_3SiO_{0.5}/SiO_2$ is 0.5 or more, adhesion strength and tackiness do not decrease; and when the ratio is 1.7 or less, adhesion strength and holding power do not decrease. It may contain an OH group, with amount of an OH group being preferably 4.0% by mass or less. When amount of an OH group is 4.0% by mass or less, cure properties of the pressure-sensitive adhesive are not impaired; and thus it is preferable.

Two or more kinds of Component (B) may be used simultaneously. Alternatively, any one of a $R^1SiO_{1.5}$ unit and a $R^1_2SiO$ unit or both may be contained in Component (B) in the range not impairing the characteristics of the present invention.

Component (A) and Component (B) may be used as a mere mixture of them; or alternatively, when Component (A) contains diorganopolysiloxane represented by the general formula (2), Component (A) and Component (B) may be used as a product of condensation reaction between them. The condensation may be done, for example, by reacting a toluene solution containing dissolved mixture of Component (A) and Component (B) in the presence of a alkali catalyst at room temperature or under reflux.

Ratio of Component (A)/Component (B) is preferably in the range from 30/70 to 70/30, more preferably in the range from 35/65 to 70/30, and still more preferably in the range from 40/60 to 50/50.

When amount of Component (A) is 30 parts by mass or more, adhesion strength is not too low at the time of bonding at room temperature and tackiness is sufficient; and thus bonding can be done easily.

When amount of Component (A) is 70 parts by mass or less, adhesion strength is difficult to increase even after the heating process, and in addition, adhesion strength decreases during re-heating, thereby making the debonding easy.

<Component (C)>

Component (C) is a crosslinking agent and is an organohydrogen polysiloxane containing at least 2 or preferably 3 or more of a hydrogen atom bonded to a silicon atom (an SiH group) in a molecule. A linear chain, a branched chain, or a cyclic form can be used.

Examples of Component (C) are shown by the following general formula (3) or (4), but Component (C) is not limited to them.

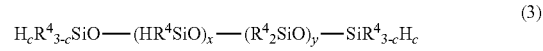

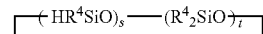

(Wherein, each $R^4$ independently represents a monovalent hydrocarbon group having 1 to 10 carbon atoms; character "c" represents 0 or 1; characters "x" and "y" represent an integer with $2c+x \geq 2$ and x+y being a number to give viscosity of the organohydrogen polysiloxane represented by the general formula (3) at 25° C. in the range from 1 to 5,000 mPa·s, preferably integers to give $x+y \geq 4$, or more preferably $200 \geq x+y \geq 8$; character "s" represents an integer of 2 or more and character "t" represents an integer of 0 or more, with $s+t \geq 3$, or preferably $8 \geq s+t \geq 3$.)

Viscosity of the organohydrogen polysiloxane of Component (C) at 25° C. is preferably in the range from 1 to 5,000 mPa·s and more preferably in the range from 5 to 500 mPa·s. The organohydrogen polysiloxane may be a mixture of two or more kinds of it.

Component (C) is blended such that its amount, in terms of mole ratio of the SiH group in Component (C) to the alkenyl group in Component (A) (SiH/alkenyl), is preferably in the range from 0.5 to 20, or in particular in the range from 2.0 to 10.0. When the mole ratio of the SiH group to the alkenyl group is 0.5 or more, the crosslinking density is not too low and there is no problem such as insufficient cure of the adhesive layer. When the mole ratio is 20 or less, the crosslinking density is not too high and sufficient adhesion strength and tackiness can be obtained. In addition, when the mole ratio is 20 or less, usable time of the treating solution can be made longer.

<Component (D)>

Component (D) is a reaction controlling agent, which is added arbitrarily if necessary in order for the treating solution not to cause increase of viscosity or gelation before thermal cure at the time of preparing a pressure-sensitive silicone adhesive composition or applying it to a substrate.

Specific examples of the agent include 3-methyl-1-butyne-3-ol, 3-methyl-1-pentyne-3-ol, 3,5-dimethyl-1-hexyne-3-ol, 1-ethynylcyclohexanol, 3-methyl-3-trimethylsiloxy-1-butyne, 3-methyl-3-trimethylsiloxy-1-pentyne, 3,5-dimethyl-3-trimethylsiloxy-1-hexyne, 1-ethynyl-1-trimethylsiloxycyclohexane, bis(2,2-dimethyl-3-butynoxy)dimethylsilane, 1,3,5,7-tetramethyl-1,3,5,7-tetravinylcyclotetrasiloxane, and 1,1,3,3-tetramethyl-1,3-divinyldisiloxane, while 1-ethynylcyclohexanol and 3-methyl-1-butyne-3-ol are preferable.

Amount of Component (D) to be blended is in the range from 0 to 8.0 parts by mass, preferably in the range from 0.01 to 8.0 parts by mass, and in particular 0.05 to 2.0 parts by mass, relative to 100 parts by mass of the sum of Components (A), (B), and (C). When the amount is 8.0 parts by mass or less, curing properties of the pressure-sensitive silicone adhesive composition are not impaired; and when the amount is 0.01 parts by mass or more, effect of the reaction control can be fully expressed.

<Component (E)>

Component (E) is a platinum catalyst (that is, a metal catalyst belonging to the platinum group); examples of it include chloroplatinic acid, an alcohol solution of chloroplatinic acid, a reaction product between chloroplatinic acid and an alcohol, a reaction product between chloroplatinic acid and an olefin compound, and a reaction product between chloroplatinic acid and a vinyl-containing siloxane.

Amount of Component (E) to be added is such that it can exhibit its effect; usually the amount is in the range from 1 to 5,000 ppm, or preferably in the range from 5 to 2,000 ppm as platinum (based on mass), relative to the sum of Components (A), (B), (C), and (D). When the amount is 1 ppm or more, curing properties of the silicone adhesive composition are not impaired, nor decrease crosslinking density and holding power; when the amount is 5,000 ppm or less, usable time of the treating solution can be made longer.

<Arbitrary Component>

A pressure-sensitive silicone adhesive composition used in the present invention can contain an arbitrary component other than each of the foregoing components. Examples of the arbitrary component to be contained include a non-reactive polyorganosiloxane such as polydimethyl siloxane and polydimethyl diphenyl siloxane; an antioxidant of such types as phenol, quinone, amine, phosphorus, phosphite, sulfur, and thioether; a photo-stabilizer of such types as triazole and benzophenone; a flame retardant of such types as phosphate ester, halogen, phosphorus, and antimony; an antistatic agent such as an cationic activator, an anionic activator, and a non-ionic activator; and a solvent that decreases viscosity at the time of application including an aromatic solvent such as toluene and xylene, an aliphatic solvent such as hexane, octane, and isoparaffin, a ketonic solvent such as methyl ethyl ketone and methyl isobutyl ketone, an ester solvent such as ethyl acetate and isobutyl acetate, and an ether solvent such as di-isopropyl ether and 1,4-dioxane, and a mixture of these solvents.

One example of a preferred form of the pressure-sensitive silicone adhesive used in the present invention is a liquid. In the present invention, this is applied onto a support substrate for processing or onto surface of formed device on a first semiconductor wafer and then cured to form a pressure-sensitive adhesive layer; and then the support substrate for processing and surface of the first semiconductor wafer can be bonded to each other.

A method for applying the adhesive is not particularly limited; for example, a spin coating or a spray coating may be used. In particular, because a spin coating method is usually used in manufacturing of a semiconductor integrated device, a process can be established without adding new manufacturing equipment. In addition, by appropriately controlling rotation number and viscosity, film thickness of the silicone adhesive layer can be controlled.

The pressure-sensitive adhesive layer may be formed on any one of surface of formed device on the first semiconductor wafer and the support substrate for processing or both.

A lamination type semiconductor integrated device may have a form of a semiconductor wafer having a projecting bump electrode to be electrically bonded to another semiconductor integrated device arranged in an upper or a lower layer. Material of construction for a bump electrode is solder, gold, silver, copper, or the like, and its form is ball-like, column-like, square-like, or the like. A bump electrode is formed as a projection from semiconductor wafer surface, and its height (difference in heights between wafer surface and top of the bump electrode) is generally in the range from 10 to 200 μm. As diversification of production process of a semiconductor chip advances, there is a case of adopting a process in that chips on a semiconductor surface is checked before back side grinding of the semiconductor wafer, and, after malfunction circuit-distinguishing mark having projection with a height in the range from 10 to 100 μm is attached to a defective chip (sometimes referred to as ink-dot), back side grinding of the semiconductor wafer is executed.

As mentioned above, when there is a projection such as a bump electrode on semiconductor wafer surface, a pressure-sensitive silicone adhesive may be applied in such a way as to flatten the semiconductor wafer surface by absorbing the projection; but it is more preferable that the silicone adhesive be applied on a support substrate for processing and then cured to form a layer of the silicone adhesive because uniform burying of a space is sometimes difficult.

As mentioned above, when a layer of the pressure-sensitive silicone adhesive is formed on a support substrate for processing, debonding of the support substrate for processing from the first semiconductor wafer can be executed easily without leaving the adhesive on the semiconductor wafer.

Another preferable form of the pressure-sensitive silicone adhesive to be used in the present invention is in a form of a pressure-sensitive silicone adhesive double coated tape. The pressure-sensitive silicone adhesive double coated tape is easy in handling, and bonding can be done by using a wafer laminator generally used in a semiconductor manufacturing process.

The pressure-sensitive silicone adhesive double coated tape having a heat resistant plastic film as a support substrate coated with a pressure-sensitive silicone adhesive on the both sides of the heat resistant plastic film is preferably used.

For example, there is sometimes a case that temperature above 150° C. for one hour or more occurs in anisotropic dry etching during making a through electrode; because of this not only the silicone adhesive but also the support material need to have heat resistance to this thermal history.

In considering protection properties of a wafer in a step of chemical treatment of wafer back side, which is optionally executed in succession to back side grinding of the semiconductor wafer, it is preferable to use a substrate film having excellent chemical resistance.

As the substrate film constituting the pressure-sensitive silicone adhesive double coated tape used in the present invention, a film obtained by molding a synthetic resin to a form of film is preferably used. The substrate film may be a single layer or a lamination of two or more layers. Further, the substrate film may be a molded thermoplastic resin or a cured thermosetting resin after it is made to a film.

Examples of raw material resin used in the substrate film include polyethylene, polypropylene, polybutene, polymethylpentene, ethylene-vinyl acetate copolymer, ethylene-ethyl acrylate copolymer, ethylene-acrylate ester-maleic anhydride copolymer, ethylene-glycidyl methacrylate copolymer, ethylene-methacrylic acid copolymer, an ionomer resin, ethylene-propylene copolymer, a thermoplastic elastomer such as a butadiene elastomer and a styrene-isoprene elastomer, a polystyrene resin, a polyvinylchloride resin, a polyvinylidene chloride resin, a polyamide resin, a polyester such as polyethylene terephthalate and polyethylene naphthalate, polyimide, polyether ether ketone, polycarbonate, polyurethane, an acryl resin, a fluorinated resin, and a cellulose resin.

Among them, a polyamide resin, polyimide, polyether ether ketone, a fluorinated resin, and the like are preferably used in view of heat resistance, chemical resistance, general versatility, and the like.

Adhesion strength of the pressure-sensitive silicone double coated tape in the adhesion side to a support substrate for processing is preferably different from that in the adhesion side to surface of formed device on a first semiconductor wafer. This is because, if the adhesion strengths in the front side and the back side are the same, it is not sure which side of the semiconductor wafer or the support substrate for processing is debonded firstly when the support substrate for processing is debonded after completion of the processing. If the adhesion strengths are different between the front side and the back side, the surface with a lighter release is debonded firstly; and thus a certain adhered side is constantly debonded for sure.

In addition, adhesion strength of the pressure-sensitive silicone adhesive double coated tape is preferably higher in the adhesion side to the support substrate for processing than in the adhesion side to the first semiconductor wafer. This is because the silicone adhesive tape can be released more surely from surface of the first semiconductor wafer having a formed device on at the time when the support substrate for processing is debonded from the first semiconductor wafer after heating process during the laminating step and the like. Even if the silicone adhesive is adhered firmly by heating processes in many process steps, that is, even if the release is made heavier, the side of higher adhesion strength is made to heavier release more eminently thereby leading to a merit that the silicone adhesive tends to be difficult to remain on surface of the first semiconductor wafer having lower adhesion strength.

It is preferable that a light side of the silicone adhesive tape to be bonded on the first semiconductor wafer be of a type whose adhesion strength decreases by heating.

As mentioned above, when the tape whose adhesion strength is endurable to grinding force at the time of back side grinding at normal temperature and decreases by re-heating at the time of release of the silicone adhesive tape is used, the adhesive tape adhered on the entire first semiconductor wafer can be released more surely.

Alternatively, in order to release the adhesive adhered on the side of surface of the first semiconductor wafer more surely, a pressure-sensitive silicone adhesive with the adhesion strength of 0.20 N/25-mm or more on the side of the support substrate for processing and having heat resistance can be used.

Examples of the pressure-sensitive silicone adhesive like this include, as an addition-cure type pressure-sensitive silicone adhesive, KR-3700 and KR-3701 (both manufactured by Shin-Etsu Chemical Co., Ltd.), and as a peroxide-cure type pressure-sensitive silicone adhesive, KR-101-10, KR-120, KR-130, and KR-100 (all manufactured by Shin-Etsu Chemical Co., Ltd.).

Figure 2:
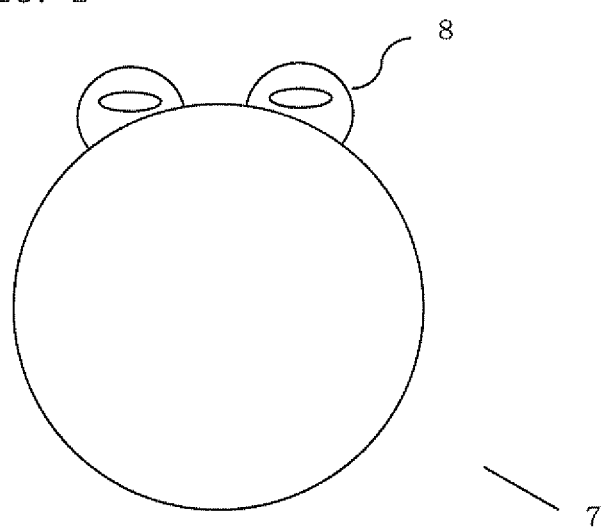
FIG. 2 is a drawing illustrating an example of the form of a pressure-sensitive silicone adhesive double coated tape preferably used in the present invention.

Size of the pressure-sensitive silicone adhesive double coated tape is preferably larger than, partly or totally, that of the support substrate for processing and the first semiconductor wafer to be bonded (see, FIG. 2).

If size of the tape is as same as the support substrate for processing and the semiconductor wafer, the thinned semiconductor integrated device is easily breakable sometimes leading to difficulty in debonding after the processing. Debonding may be done by inserting a rod-like debonding paddle having a flat end into the space between the semiconductor integrated device and the support substrate for processing; but in this case there is a fear of breaking the semiconductor integrated device. Alternatively, a through hole is formed in advance in the support substrate for processing, and then debonding may be done by pushing up with a rod-like matter; but in this case a force greater than breaking the thinned semiconductor device is needed because the support substrate for processing and the semiconductor wafer are bonded on the entire surfaces; and thus this method is not suitable. In addition, there may be a case that in-plane uniformity of the semiconductor wafer after thinning is impaired.

However, if size of the silicone adhesive tape is larger than, partly or totally, that of the support substrate for processing and the first semiconductor wafer, the adhesive tape can be released easily by using this large portion as the supporting point.

If the pressure-sensitive silicone adhesive double coated tape is sufficiently larger than the support substrate for processing and the first semiconductor wafer, the release can be executed more easily by holding the largely spread-out portion.

A way of this holding method is not particularly limited; but for example, as shown in FIG. 2, a ring portion may be arranged, or reinforcement by another material thereby enabling easy holding may be used.

In the method of the present invention, if there occurs such cases that, due to a projection matter such as a bump electrode formed on surface, the silicone adhesive cannot fully penetrate between the bumps so that concavity and convexity are formed during thinning process such as back side grinding or so-called floating-up occurs, an intermediate layer may be arranged to flatten surface of the semiconductor wafer to absorb the projection so that flatness and dense contact may be obtained. The intermediate layer may be a single layer or formed of two or more layers.

The intermediate layer may be formed by a spin coating method or a dip method with a curable material such as a resist ink, which can be removed afterward, so as to make surface of the semiconductor wafer flat. Alternatively, a material having a flexible layer such as gel or rubber and on it a substance having surface tackiness, that is, a material having a layer applied with a pressure-sensitive silicone adhesive having the adhesion strength in the range from 0.02 to 0.20 N/25-mm further on the flexible layer such as gel or rubber, may be used, though the method for forming the intermediate layer is not limited to it.

In the case of forming the intermediate layer, the layer needs to have sufficiently large cohesive force relative to the grinding force, not to be damaged by a chemical, and to have heat resistance; from these view points, a silicone material, specifically a silicone gel, silicone rubber, or the like is suitably used.

A pressure-sensitive adhesion tape having at least one intermediate layer on one side of a substrate film, to which side is contacted surface of formed device on a first semiconductor wafer, and on the other side of the film is arranged a pressure-sensitive silicone adhesive layer having high adhesion strength to adhere a support substrate for processing, is preferably used.

Further, a pressure-sensitive silicone adhesive double coated tape, having, on one side of a substrate film, at least one intermediate layer and a layer of the pressure-sensitive silicone adhesive used in the present invention having adhesion strength in the range from 0.02 to 0.20 N/25-mm, to which side is contacted surface of formed device on a first semiconductor wafer, and on the other side of the film is arranged a layer of a pressure-sensitive silicone adhesive having high adhesion strength to adhere a support substrate for processing, is more preferably used.

Thickness of the adhesive layer to be formed may be appropriately controlled depending on adhesion strength of the pressure-sensitive silicone adhesive.

For example, thickness of the pressure-sensitive silicone adhesive layer having adhesion strength to the semiconductor wafer in the range from 0.02 to 0.20 N/25-mm is preferably in the range from 1 to 20 μm, or more preferably in the range from 5 to 10 μm. If the thickness is 1 μm or more, sufficient adhesion strength can be obtained, and if the thickness is 20 μm or less, the projection matter can be absorbed for sure.

A semiconductor wafer preferably used in a method for manufacturing a lamination type semiconductor integrated device of the present invention will be explained.

The semiconductor wafer usable in the present invention includes not only a silicon wafer but also such wafers as germanium, gallium-arsenic, gallium-phosphorous, and gallium-arsenic-aluminum.

A form of an integrated circuit formed on the wafer surface to which a method for manufacturing a lamination type semiconductor integrated device of the present invention is applicable is not particularly limited; the method is applicable to all of heretofore known semiconductor wafers.

EXAMPLES

Hereinafter, the present invention will be explained in more detail by showing Examples, but the present invention is not limited to these Examples.

In all of Examples and Comparative Examples shown hereinafter, preparation and application of a coating liquid, drying, curing, back side grinding of a semiconductor silicon wafer, and so on are executed under the environment kept in the class with the cleanness degree of 1,000 or less.

Example 1

Into a mixture solution, comprised of 40 parts by mass of vinyl-containing polydimethylsiloxane, whose both terminals of the molecular chain were blocked with an $SiMe_2Vi$ group, containing 7.5% by mole of a vinyl group and having viscosity of 22,000 mPa·s (viscosity of its 30%-toluene solution), 100 parts by mass of 60%-toluene solution of polysiloxane comprised of a $Me_3SiO_{0.5}$ unit and an $SiO_2$ unit ($Me_3SiO_{0.5}/SiO_2=0.80$), and 26.7 parts by mass of toluene, were added 7.8 parts by mass of the crosslinking agent shown by the following formula (F), and 0.1 parts by mass of ethynyl cyclohexanol, and they were mixed.

$$Me_3SiO-[MeHSiO]_{40}-SiMe_3 \tag{F}$$

(Wherein Me indicates a methyl group and Vi indicates a vinyl group.)

Into 100 parts by mass of the resulting mixture were added 50 parts by mass of toluene and 0.5 parts by mass of a platinum catalyst CAT-PL-50T (manufactured by Shin-Etsu Chemical Co., Ltd.); the mixture thus obtained was further mixed to obtain a solution of a pressure-sensitive silicone adhesive composition containing approximately 40% of the siloxane component. A pressure-sensitive silicone adhesive double coated tape was prepared from the silicone adhesive thus obtained; and adhesion strength was measured and items (1) to (5) were evaluated.

Example 2

Into a mixture solution, comprised of 70 parts by mass of vinyl-containing polydimethylsiloxane, whose both terminals of the molecular chain were blocked with an $SiMe_2Vi$ group, containing 3% by mole of a vinyl group and having viscosity of 22,000 mPa·s (viscosity of its 30%-toluene solution), 50 parts by mass of 60%-toluene solution of polysiloxane comprised of a $Me_3SiO_{0.5}$ unit and an $SiO_2$ unit ($Me_3SiO_{0.5}/SiO_2=0.80$), and 46.7 parts by mass of toluene, were added 5.4 parts by mass of the crosslinking agent (F) and 0.1 parts by mass of ethynyl cyclohexanol, and they were mixed.

Into 100 parts by mass of the resulting mixture were added 50 parts by mass of toluene and 0.5 parts by mass of a platinum catalyst CAT-PL-50T (manufactured by Shin-Etsu Chemical Co., Ltd.); the mixture thus obtained was further mixed to obtain a solution of a pressure-sensitive silicone adhesive composition containing approximately 40% of the siloxane component. A pressure-sensitive silicone adhesive double coated tape was prepared from the silicone adhesive thus obtained; and adhesion strength was measured and items (1) to (5) were evaluated.

Example 3

Into a mixture solution, comprised of 90 parts by mass of vinyl-containing polydimethylsiloxane, whose both terminals of the molecular chain were blocked with an SiMe$_2$Vi group, containing 3% by mole of a vinyl group and having viscosity of 22,000 mPa·s (viscosity of its 30%-toluene solution), 16.7 parts by mass of 60%-toluene solution of polysiloxane comprised of a Me$_3$SiO$_{0.5}$ unit and an SiO$_2$ unit (Me$_3$SiO$_{0.5}$/SiO$_2$=0.80), and 60 parts by mass of toluene, were added 6.9 parts by mass of the crosslinking agent (F) and 0.1 parts by mass of ethynyl cyclohexanol, and they were mixed.

Into 100 parts by mass of the resulting mixture were added 50 parts by mass of toluene and 0.5 parts by mass of a platinum catalyst CAT-PL-50T (manufactured by Shin-Etsu Chemical Co., Ltd.); the mixture thus obtained was further mixed to obtain a solution of a pressure-sensitive silicone adhesive composition containing approximately 40% of the siloxane component. A pressure-sensitive silicone adhesive double coated tape was prepared from the silicone adhesive thus obtained; and adhesion strength was measured and items (1) to (5) were evaluated.

Example 4

Into a mixture solution, comprised of 40 parts by mass of vinyl-containing polydimethylsiloxane, whose both terminals of the molecular chain were blocked with an SiMe$_2$Vi group, containing 0.75% by mole of a vinyl group and having viscosity of 25,000 mPa·s (viscosity of its 30%-toluene solution), 100 parts by mass of 60%-toluene solution of polysiloxane comprised of a Me$_3$SiO$_{0.5}$ unit and an SiO$_2$ unit (Me$_3$SiO$_{0.5}$/SiO$_2$=0.80), and 26.7 parts by mass of toluene, were added 0.8 parts by mass of the crosslinking agent (F) and 0.1 parts by mass of ethynyl cyclohexanol, and they were mixed.

Into 100 parts by mass of the resulting mixture were added 50 parts by mass of toluene and 0.5 parts by mass of a platinum catalyst CAT-PL-50T (manufactured by Shin-Etsu Chemical Co., Ltd.); the mixture thus obtained was further mixed to obtain a solution of a pressure-sensitive silicone adhesive composition containing approximately 40% of the siloxane component. A pressure-sensitive silicone adhesive double coated tape was prepared from the silicone adhesive thus obtained; and adhesion strength was measured and items (1) to (5) were evaluated.

Example 5

Into a mixture solution, comprised of 70 parts by mass of vinyl-containing polydimethylsiloxane, whose both terminals of the molecular chain were blocked with an SiMe$_2$Vi group, containing 1.5% by mole of a vinyl group and having viscosity of 25,000 mPa·s (viscosity of its 30%-toluene solution), 50 parts by mass of 60%-toluene solution of polysiloxane comprised of a Me$_3$SiO$_{0.5}$ unit and an SiO$_2$ unit (Me$_3$SiO$_{0.5}$/SiO$_2$=0.80), and 46.7 parts by mass of toluene, were added 3.5 parts by mass of the crosslinking agent (F) and 0.1 parts by mass of ethynyl cyclohexanol, and they were mixed.

Into 100 parts by mass of the resulting mixture were added 50 parts by mass of toluene and 0.5 parts by mass of a platinum catalyst CAT-PL-50T (manufactured by Shin-Etsu Chemical Co., Ltd.); the mixture thus obtained was further mixed to obtain a solution of a pressure-sensitive silicone adhesive composition containing approximately 40% of the siloxane component. A pressure-sensitive silicone adhesive double coated tape was prepared from the silicone adhesive thus obtained; and adhesion strength was measured and items (1) to (5) were evaluated.

Example 6

Into a mixture solution, comprised of 90 parts by mass of vinyl-containing polydimethylsiloxane, whose both terminals of the molecular chain were blocked with an SiMe$_2$Vi group, containing 1.5% by mole of a vinyl group and having viscosity of 25,000 mPa·s (viscosity of its 30%-toluene solution), 16.7 parts by mass of 60%-toluene solution of polysiloxane comprised of a Me$_2$SiO$_{0.5}$ unit and an SiO$_2$ unit (Me$_3$SiO$_{0.5}$/SiO$_2$=0.80), and 60 parts by mass of toluene, were added 3.5 parts by mass of the crosslinking agent (F) and 0.1 parts by mass of ethynyl cyclohexanol, and they were mixed.

Into 100 parts by mass of the resulting mixture were added 50 parts by mass of toluene and 0.5 parts by mass of a platinum catalyst CAT-PL-50T (manufactured by Shin-Etsu Chemical Co., Ltd.); the mixture thus obtained was further mixed to obtain a solution of a pressure-sensitive silicone adhesive composition containing approximately 40% of the siloxane component. A pressure-sensitive silicone adhesive double coated tape was prepared from the silicone adhesive thus obtained; and adhesion strength was measured and items (1) to (5) were evaluated.

Example 7

Into a mixture solution, comprised of 40 parts by mass of vinyl-containing polydimethylsiloxane, whose both terminals of the molecular chain were blocked with an SiMe$_2$Vi group, containing 8% by mole of a vinyl group and having viscosity of 24,000 mPa·s (viscosity of its 30%-toluene solution), 100 parts by mass of 60%-toluene solution of polysiloxane comprised of a Me$_3$SiO$_{0.5}$ unit and an SiO$_2$ unit (Me$_3$SiO$_{0.5}$/SiO$_2$=0.80), and 26.7 parts by mass of toluene, were added 5.5 parts by mass of the crosslinking agent (F) and 0.1 parts by mass of ethynyl cyclohexanol, and they were mixed.

Into 100 parts by mass of the resulting mixture were added 50 parts by mass of toluene and 0.5 parts by mass of a platinum catalyst CAT-PL-50T (manufactured by Shin-Etsu Chemical Co., Ltd.); the mixture thus obtained was further mixed to obtain a solution of a pressure-sensitive silicone adhesive composition containing approximately 40% of the siloxane component. A pressure-sensitive silicone adhesive double coated tape was prepared from the silicone adhesive thus obtained; and adhesion strength was measured and items (1) to (5) were evaluated.

Example 8

Into a mixture solution, comprised of 70 parts by mass of vinyl-containing polydimethylsiloxane, whose both terminals of the molecular chain were blocked with an SiMe$_2$Vi group, containing 8% by mole of a vinyl group and having viscosity of 24,000 mPa·s (viscosity of its 30%-toluene solution), 50 parts by mass of 60%-toluene solution of polysiloxane comprised of a Me$_3$SiO$_{0.5}$ unit and an SiO$_2$ unit (Me$_3$SiO$_{0.5}$/SiO$_2$=0.80), and 46.7 parts by mass of toluene, were added 9.6 parts by mass of the crosslinking agent (F) and 0.1 parts by mass of ethynyl cyclohexanol, and they were mixed.

Into 100 parts by mass of the resulting mixture were added 50 parts by mass of toluene and 0.5 parts by mass of a platinum catalyst CAT-PL-50T (manufactured by Shin-Etsu Chemical Co., Ltd.); the mixture thus obtained was further mixed to obtain a solution of a pressure-sensitive silicone adhesive composition containing approximately 40% of the siloxane component. A pressure-sensitive silicone adhesive double coated tape was prepared from the silicone adhesive thus obtained; and adhesion strength was measured and items (1) to (5) were evaluated.

Example 9

Into a mixture solution, comprised of 60 parts by mass of vinyl-containing polydimethylsiloxane, whose both terminals of the molecular chain were blocked with an $SiMe_2Vi$ group, containing 0.6% by mole of a vinyl group and having viscosity of 24,000 mPa·s (viscosity of its 30%-toluene solution), 66.7 parts by mass of 60%-toluene solution of polysiloxane comprised of a $Me_3SiO_{0.5}$ unit and an $SiO_2$ unit ($Me_3SiO_{0.5}/SiO_2$=0.80), and 40 parts by mass of toluene, were added 1.5 parts by mass of the crosslinking agent (F) and 0.1 parts by mass of ethynyl cyclohexanol, and they were mixed.

Into 100 parts by mass of the resulting mixture were added 50 parts by mass of toluene and 0.5 parts by mass of a platinum catalyst CAT-PL-50T (manufactured by Shin-Etsu Chemical Co., Ltd.); the mixture thus obtained was further mixed to obtain a solution of a pressure-sensitive silicone adhesive composition containing approximately 40% of the siloxane component. A pressure-sensitive silicone adhesive double coated tape was prepared from the silicone adhesive thus obtained; and adhesion strength was measured and items (1) to (5) were evaluated.

Example 10

Into a mixture solution, comprised of 90 parts by mass of vinyl-containing polydimethylsiloxane, whose both terminals of the molecular chain were blocked with an $SiMe_2Vi$ group, containing 0.6% by mole of a vinyl group and having viscosity of 24,000 mPa·s (viscosity of its 30%-toluene solution), 16.7 parts by mass of 60%-toluene solution of polysiloxane comprised of a $Me_3SiO_{0.5}$ unit and an $SiO_2$ unit ($Me_3SiO_{0.5}/SiO_2$=0.80), and 60 parts by mass of toluene, were added 2.3 parts by mass of the crosslinking agent (F) and 0.1 parts by mass of ethynyl cyclohexanol, and they were mixed.

Into 100 parts by mass of the resulting mixture were added 50 parts by mass of toluene and 0.5 parts by mass of a platinum catalyst CAT-PL-50T (manufactured by Shin-Etsu Chemical. Co., Ltd.); the mixture thus obtained was further mixed to obtain a solution of a pressure-sensitive silicone adhesive composition containing approximately 40% of the siloxane component. A pressure-sensitive silicone adhesive double coated tape was prepared from the silicone adhesive thus obtained; and adhesion strength was measured and items (1) to (5) were evaluated.

Comparative Example 1

A pressure-sensitive acryl adhesive was applied by using an applicator onto a polyimide film having 25 μm thickness so as to give film thickness of 15 μm after cure, and then cured by heating at 100° C. for 3 minutes to obtain a pressure-sensitive acryl adhesive film. A pressure-sensitive adhesive double coated tape was obtained by using KR-3700 (manufactured by Shin-Etsu Chemical Co., Ltd.) on the side to a support substrate for processing; and adhesion strength was measured and items (1) to (5) were evaluated.

Comparative Example 2

A pressure-sensitive rubber adhesive was applied by using an applicator onto a polyimide film having 25 μm thickness so as to give film thickness of 15 μm after cure, and then cured by heating at 100° C. for 3 minutes to obtain a pressure-sensitive rubber adhesive film. A pressure-sensitive adhesive double coated tape was obtained by using KR-3700 (manufactured by Shin-Etsu Chemical Co., Ltd.) on the side to a support substrate for processing; and adhesion strength was measured and items (1) to (5) were evaluated.

It must be noted here that the preparation of the pressure-sensitive silicone adhesive double coated tape, shown by Examples 1 to 10, and measurement of adhesion strengths and evaluation of items (1) to (5), shown by Examples 1 to 10 and Comparative Examples 1 to 2, are done according to the methods as shown below.

[Measurement of Adhesion Strengths]
Initial Adhesion Strength

A pressure-sensitive silicone adhesive composition was applied by using an applicator onto a polyimide film having 25 μm thickness so as to give film thickness of 15 μm after cure, and then cured by heating at 130° C. for one minute to obtain a pressure-sensitive adhesive film. After the adhesive film thus obtained was cut to a tape having a width of 25 mm, the tape was adhered onto a stainless steel plate, and then press adhered by two reciprocal movements of a 2-kg roller covered with a rubber layer. After it was allowed to stand for approximately 20 hours at room temperature, a force (N/25-mm) needed to release the tape from the stainless steel plate with an angle of 180 degree at the release speed of 300 mm/minute was measured by using a tensile testing machine.

Adhesion Strength after Heating at 250° C. for Two Hours

A pressure-sensitive adhesive film was prepared in the same way as the film for evaluation of initial adhesion strength. After the adhesive film thus obtained was cut to a tape having a width of 25 mm, the tape was adhered onto a stainless steel plate, and then press adhered by two reciprocal movements of a 2-kg roller covered with a rubber layer. After it was allowed to stand for approximately 20 hours at room temperature, it was heated at 250° C. for 2 hours, and then cooled to room temperature; a force (N/25-mm) needed to release the tape from the stainless steel plate with an angle of 180 degree at the release speed of 300 mm/minute was measured by using a tensile testing instrument.

Adhesion Strength During Heating at 140° C.

A pressure-sensitive adhesive film was prepared in the same way as the film for evaluation of initial adhesion strength. After the adhesive film thus obtained was cut to a tape having a width of 25 mm, the tape was adhered onto a stainless steel plate, and then press adhered by two reciprocal movements of a 2-kg roller covered with a rubber layer. After it was allowed to stand for approximately 20 hours at room temperature, it was heated at 250° C. for 2 hours, cooled to room temperature, and heated to 140° C.; while heating is continued, a force (N/25-mm) needed to release the tape from the stainless steel plate with an angle of 180 degree at the release speed of 300 mm/minute was measured by using a tensile testing instrument.

[Preparation Method for Pressure-Sensitive Silicone Adhesive Double Coated Tape]

A pressure-sensitive silicone adhesive double coated tape was prepared as following.

Each of the pressure-sensitive silicone adhesives used in Examples was applied onto one surface of a polyimide film (trade name: Kapton 100H, manufactured by Du Pont-Toray Co., Ltd.; film thickness of 25 μm) by using an applicator so as to give film thickness of 15 μm after drying, and then cured by heating at 130° C. for one minute to obtain a single-sided pressure-sensitive adhesive tape having the side for adhering a semiconductor wafer. Properties of each of the pressure-sensitive adhesives are shown in Table 1. On this adhesive surface, a polyethylene terephthalate film (Trade name: Lumilar S10, manufactured by Toray Industries, Inc.; film thickness of 23 μm) was bonded to protect its surface. Then, on the opposite surface to the side for adhering a semiconductor wafer (that is, on the side for adhering a support substrate for processing), a pressure-sensitive silicone adhesive composition (obtained by adding 0.5 parts by mass of a catalyst (trade name: CAT-PL-50T, manufactured by Shin-Etsu Chemical Co., Ltd.) into a solution obtained by dissolving 100 parts by mass of a strongly adhering addition-type pressure-sensitive silicone adhesive (trade name: KR-3700, manufactured by Shin-Etsu Chemical Co., Ltd.) into 100 parts by mass of toluene) was applied by using an applicator so as to give film thickness of 15 μm after drying, and then cured by heating at 130° C. for one minute to obtain a pressure-sensitive silicone adhesive double coated tape having a side for adhering a semiconductor wafer and a side for adhering a support substrate for processing. Onto the side for adhering a support substrate for processing was bonded a polyethylene terephthalate release film previously applied with a releasing agent for the pressure-sensitive silicone adhesive (trade name: X-70-201, manufactured by Shin-Etsu Chemical Co., Ltd.) to protect the adhesive surface.

The pressure-sensitive silicone adhesive double coated tape thus obtained was cut to a round form with 300 mm diameter having two ears (holding portion 8) as shown in FIG. 2 to obtain a test sample 7. By using this test sample, items (1) to (5) were evaluated.

[Evaluation Methods]

(1) Re-Bonding Property: Non-Break Ratio of Silicon Wafer

Each of the pressure-sensitive silicone adhesive double coated tapes obtained in Examples and Comparative Examples is bonded by using a wafer laminator on a glass plate (diameter of 300 mm and thickness of 5 mm) used as the support substrate for processing. Thereafter, it is bonded to a semiconductor silicon wafer (diameter of 300 mm and thickness of 765 μm) and then confirmation is made whether re-bonding is possible or not freshly (1). When debonding and re-bonding cannot be executed, it is judged as defective.

(2) Grinding Force Resistance: Grindable Ratio of Silicon Wafers

A bond of a semiconductor silicon wafer with a support substrate for processing obtained by the method (1) is grinding-processed by using a grinding equipment (Type: DFG 860, manufactured by DISCO Corp.) on back side of the wafer with pouring water for cooling by using the support substrate for processing as a sticking face to make 100 μm of wafer thickness after grinding process. After completion of the grinding process, wafer back side of each of semiconductor silicon wafers is observed whether or not there is a trace of semiconductor wafer rotation caused by failing to endure grinding force, a crack, or a dimple (2). The wafer having an observed trace of semiconductor silicon wafer rotation (rotation), a crack, or a generated dimple (dimple) is judged as defective.

(3) Chemical Resistance: Non-Penetration Ratio of Chemical

A bond of the semiconductor silicon wafer with the support substrate for processing after evaluation (2) is heated at 200° C. for 2 hours in simulating formation of a through electrode and then cooled to 25° C. After cooling, each semiconductor silicon wafer is soaked in each chemical for one hour, pulled up from the chemical, and then washed; thereafter, penetration trace of the chemical between the support substrate for processing and the semiconductor silicon wafer is observed from the side of the support substrate for processing (3). The sample having a penetration trace of the chemical is judged as defective. Chemicals used for evaluation are a copper plating liquid, a nickel plating liquid, a tin-silver plating liquid, a resist releasing liquid (ethanolamine-DMSO mixed solution), and a copper etching liquid. For those judged as defective in evaluation (2), chemical resistance was evaluated separately without grinding; and for those unendurable to heating at 200° C. for 2 hours, chemical resistance was evaluated without heating.

(4) Releasability: Releasable Ratio During Heating at 140° C.

After confirmation of penetrating trace of a chemical in (3), the sample is heated again to 140° C.; while heating is continued, a portion of the pressure-sensitive silicone adhesive double coated tape run-off from the support substrate for processing is held by a clip and released to a vertical direction; and then whether the release is possible or not is confirmed (4). When release cannot be executed or the semiconductor wafer is cracked, it is judged as defective.

(5) Adherend Staining Properties: Unremaining Ratio of the Adhesive on Adherend

The wafer that is released in (4) is spin-cleaned by toluene, and then the silicone adhesive residue remained on its surface is observed on the luminescent spot by an optical microscope at 1000-fold magnification (5). A sample having an observed luminescent spot is judged as defective.

The results of Examples 1 to 10 and Comparative Examples 1 to 2 are shown in Table 1.

It must be noted here that the numbers in the Table show the rate of non-defective (100%: all samples are non-defective, 0%: all samples are defective).

TABLE 1

|  | vinyl mole % | gum/resin ratio | adhesion strength N/25-mm | | | evaluation item | | | | |
| --- | --- | --- | --- | --- | --- | --- | --- | --- | --- | --- |
|  |  |  | 25° C. | after 250° C./2 h heating | during heating at 140° C. | (1) | (2) | (3) | (4) | (5) |
| Example 1 | 7.5 | 40/60 | 0.08 | 0.08 | 0.01 | 100% | 100% | 100% | 100% | 100% |
| Example 2 | 3 | 70/30 | 0.08 | 0.25 | 0.02 | 100% | 100% | 100% | 100% | 100% |
| Example 3 | 3 | 90/10 | 0.01 | 1.4 | 0.25 | 100% | 60% | 100% | 70% | 100% |
| Example 4 | 0.75 | 40/60 | 0.07 | 0.15 | 0.01 | 100% | 100% | 100% | 100% | 100% |
| Example 5 | 1.5 | 70/30 | 0.05 | 0.20 | 0.02 | 100% | 100% | 100% | 100% | 100% |
| Example 6 | 1.5 | 90/10 | 0.01 | 1.4 | 0.18 | 100% | 60% | 100% | 100% | 100% |
| Example 7 | 8 | 40/60 | 0.01 | 0.25 | 0.01 | 100% | 50% | 100% | 100% | 100% |
| Example 8 | 8 | 70/30 | 0.01 | 0.30 | 0.08 | 100% | 50% | 100% | 100% | 100% |
| Example 9 | 0.6 | 60/40 | 0.18 | 1.4 | 0.35 | 100% | 100% | 100% | 60% | 100% |

TABLE 1-continued

| | | adhesion strength N/25-mm | | | | | | | |
|---|---|---|---|---|---|---|---|---|---|
| vinyl | gum/ resin | | after 250° C./2 h | during heating at | evaluation item | | | | |
| mole % | ratio | 25° C. | heating | 140° C. | (1) | (2) | (3) | (4) | (5) |
| Example 10 | 0.6 | 90/10 | 0.01 | 1.1 | 0.42 | 100% | 60% | 100% | 50% | 100% |
| Comparative Example 1 | acryl adhesive | | 0.22 | melted | 0.00 | 10% | 100% | 10% | 100% | 0% |
| Comparative Example 2 | rubber adhesive | | 0.10 | melted | 0.00 | 10% | 100% | 0% | 100% | 0% |

As shown in Table 1, it was confirmed that Examples 1 to 10 gave 50% or more of non-defective products in any of (1) re-bonding, (2) grinding force resistance, (3) chemical resistance, (4) releasability at 140° C., and (5) adherend staining properties, showing high productivity in these Examples.

Especially, in Examples 1, 2, 4, and 5, in which Component (A) of the pressure-sensitive silicone adhesive was in the range from 30 to 70 parts by mass and content of the alkenyl group was in the range from 0.75 to 7.5% by mole, the non-defective rate of 100% could be obtained in any of evaluation items (1) to (5). That is, it can be seen that, when the pressure-sensitive silicone adhesive like this is used, a lamination type semiconductor integrated device can be manufactured even with higher productivity.

On the other hand, in Comparative Examples 1 and 2, the pressure-sensitive adhesive was melted by heating at 250° C. for 2 hours in simulating formation of a through electrode. This shows that a conventional acryl and rubber adhesive do not have heat resistance endurable in the through electrode formation, in other words, this indicates that the through electrode cannot be formed.

Even in the case that heating is not done, low values of 0 to 10% are obtained in evaluation items (3) and (5), indicating productivity is very low.

In Comparative Examples 1 and 2, evaluation result of the item (1) is 10% in any of them, indicating that re-bonding is difficult if there occurs, before back side grinding of the semiconductor wafer, a nonuniformity trouble at the time of bonding with the substrate for processing.

Examples 11 to 20

Examples 11 to 20 were done by using the pressure-sensitive silicone adhesive composition of Examples 1 to 10 in a liquid form.

In Examples 11 to 20, the pressure-sensitive silicone adhesive composition was applied as a liquid form onto a support substrate for processing, and after curing, onto a side having the formed silicone adhesive layer was bonded surface of formed device on a semiconductor wafer; by using this, items (1) to (3) and (5) were evaluated. Evaluation of releasability of the pressure-sensitive adhesive was done by a method shown as following (4').

(4') Releasability: Removal Ratio of Pressure-Sensitive Silicone Adhesive

After confirmation of penetrating trace of a chemical in (3), each semiconductor wafer was soaked in xylene solution for one hour; and then the silicone adhesive was released. When the silicone adhesive could not be released, it was judged as defective.

Results of Examples 11 to 20 are shown in Table 2.

TABLE 2

| | evaluation item | | | | |
|---|---|---|---|---|---|
| | (1) | (2) | (3) | (4') | (5) |
| Example 11 | 100% | 100% | 100% | 100% | 100% |
| Example 12 | 100% | 100% | 100% | 100% | 100% |
| Example 13 | 100% | 70% | 100% | 100% | 100% |
| Example 14 | 100% | 100% | 100% | 100% | 100% |
| Example 15 | 100% | 100% | 100% | 100% | 100% |
| Example 16 | 100% | 70% | 100% | 100% | 100% |
| Example 17 | 100% | 60% | 100% | 100% | 100% |
| Example 18 | 100% | 60% | 100% | 100% | 100% |
| Example 19 | 90% | 100% | 100% | 100% | 100% |
| Example 20 | 90% | 60% | 100% | 100% | 100% |

As shown in Table 2, even when a pressure-sensitive silicone adhesive in a liquid form was used, high productivity with non-defective rate of 60% or more could be obtained in all of the evaluation items (1) to (5); especially it was confirmed that debonding of the support substrate for processing could be done smoothly at the end and that adherend staining properties were excellent.

As can be seen in the foregoing description, when the method for manufacturing a lamination type semiconductor integrated device of the present invention is used, grinding force resistance during back side grinding of a wafer, heat resistance during heating process in step of laminating by electrical bonding, chemical resistance during cleaning or the like of a semiconductor wafer, smooth debonding of a support substrate for processing at the end, and low adherend staining can be attained simultaneously; and thus it can be said that the present invention is demonstrated to be an extremely useful method in manufacturing of a lamination type semiconductor integrated device.

It must be noted here that the present invention is not limited to the embodiments as described above. The foregoing embodiments are examples, and any embodiment having substantially the same construction as the technical idea described in claims of the present invention and similar effects to those described therein is included in the technical scope of the present invention.

What is claimed is:

1. A method for manufacturing a lamination type semiconductor integrated device, the method comprising at least:
    a step of back side grinding of a first semiconductor wafer having a device formed on its surface, and
    a step of laminating by electrical bonding the first semiconductor wafer with a second semiconductor wafer having a device formed on its surface, wherein:
at the time of the back side grinding of the first semiconductor wafer, the back side of the first semiconductor wafer is ground after the surface of the first semiconductor wafer upon which the device is formed is bonded to a support substrate for processing by using a pressure-sensitive silicone adhesive.

2. The method for manufacturing the lamination type semiconductor integrated device according to claim 1, wherein:
an adhesion strength of the pressure-sensitive silicone adhesive at room temperature is in a range from 0.02 to 0.20 N/25-mm, and
the adhesion strength after a heating process in the step of laminating by electrical bonding is 0.20 N/25-mm or less.

3. The method for manufacturing the lamination type semiconductor integrated device according to claim 1, wherein:
an adhesion strength of the pressure-sensitive silicone adhesive at room temperature is in a range from 0.02 to 0.20 N/25-mm,
the adhesion strength after a heating process in the step of laminating by electrical bonding is 1.00 N/25-mm or less, and
the adhesion strength during re-heating at 70 to 200° C. is 0.20 N/25-mm or less.

4. The method for manufacturing the lamination type semiconductor integrated device according to claim 1, wherein:
the pressure-sensitive silicone adhesive comprises:
(A) 30 to 70 parts by mass of a diorganopolysiloxane containing 2 or more alkenyl groups in a molecule and having a viscosity of 10,000 mPa·s or more at 25° C.,
(B) 70 to 30 parts by mass of a polyorganosiloxane containing a $R^1_3SiO_{0.5}$ unit and an $SiO_2$ unit with a mole ratio $R^1_3SiO_{0.5}/SiO_2$ being in a range from 0.5 to 1.7 ($R^1$ independently represents a substituted or a unsubstituted monovalent hydrocarbon group having 1 to 10 carbon atoms), wherein the sum of Components (A) and (B) is 100 parts by mass,
(C) an organohydrogen polysiloxane containing 2 or more SiH groups in a molecule with a mole ratio of the SiH groups in Component (C) to the alkenyl groups in Component (A) being in a range from 0.5 to 20,
(D) 0 to 8.0 parts by mass of a reaction controlling agent relative to 100 parts by mass of a sum of Components (A), (B), and (C), and
(E) an effective amount of a Pt catalyst.

5. The method for manufacturing the lamination type semiconductor integrated device according to claim 2, wherein:
the pressure-sensitive silicone adhesive comprises:
(A) 30 to 70 parts by mass of a diorganopolysiloxane containing 2 or more alkenyl groups in a molecule and having a viscosity of 10,000 mPa·s or more at 25° C.,
(B) 70 to 30 parts by mass of a polyorganosiloxane containing a $R^1_3SiO_{0.5}$ unit and an $SiO_2$ unit with a mole ratio $R^1_3SiO_{0.5}/SiO_2$ being in a range from 0.5 to 1.7 ($R^1$ independently represents a substituted or a unsubstituted monovalent hydrocarbon group having 1 to 10 carbon atoms), wherein the sum of Components (A) and (B) is 100 parts by mass,
(C) an organohydrogen polysiloxane containing 2 or more SiH groups in a molecule with a mole ratio of the SiH groups in Component (C) to the alkenyl groups in Component (A) being in a range from 0.5 to 20,
(D) 0 to 8.0 parts by mass of a reaction controlling agent relative to 100 parts by mass of a sum of Components (A), (B), and (C), and
(E) an effective amount of a Pt catalyst.

6. The method for manufacturing the lamination type semiconductor integrated device according to claim 3, wherein:
the pressure-sensitive silicone adhesive comprises:
(A) 30 to 70 parts by mass of a diorganopolysiloxane containing 2 or more alkenyl groups in a molecule and having a viscosity of 10,000 mPa·s or more at 25° C.,
(B) 70 to 30 parts by mass of a polyorganosiloxane containing a $R^1_3SiO_{0.5}$ unit and an $SiO_2$ unit with a mole ratio $R^1_3SiO_{0.5}/SiO_2$ being in a range from 0.5 to 1.7 ($R^1$ independently represents a substituted or a unsubstituted monovalent hydrocarbon group having 1 to 10 carbon atoms), wherein the sum of Components (A) and (B) is 100 parts by mass,
(C) an organohydrogen polysiloxane containing 2 or more SiH groups in a molecule with a mole ratio of the SiH groups in Component (C) to the alkenyl groups in Component (A) being in a range from 0.5 to 20,
(D) 0 to 8.0 parts by mass of a reaction controlling agent relative to 100 parts by mass of a sum of Components (A), (B), and (C), and
(E) an effective amount of a Pt catalyst.

7. The method for manufacturing the lamination type semiconductor integrated device according to claim 4, wherein Component (A) in the pressure-sensitive silicone adhesive is a diorganopolysiloxane represented by any one of the following general formula (1) and formula (2) or both:

$$R^2_{(3-a)}X_aSiO-(R^2XSiO)_m-(R^2_2SiO)_n-SiR^2_{(3-a)}X_a \quad (1)$$

$$R^2_2(HO)SiO-(R^2XSiO)_{m+2}-(R^2_2SiO)_n-SiR^2_2(OH) \quad (2)$$

wherein:
each $R^2$ independently represents a monovalent hydrocarbon group not containing an aliphatic unsaturated bond;
each X independently represents an alkenyl-containing monovalent organic group;
character "a" represents an integer of 0 to 3;
2a+m indicates a number giving content of an alkenyl group in a range from 0.75 to 7.5% by mole in a molecule;
character "n" represents a number of 100 or more; and
m+n indicates a number giving a polydiorganosiloxane represented by any one of the general formula (1) and formula (2) or both having a viscosity of 10,000 mPa·s or more at 25° C.

8. The method for manufacturing the lamination type semiconductor integrated device according to claim 5, wherein Component (A) in the pressure-sensitive silicone adhesive is a diorganopolysiloxane represented by any one of the following general formula (1) and formula (2) or both:

$$R^2_{(3-a)}X_aSiO-(R^2XSiO)_m-(R^2_2SiO)_n-SiR^2_{(3-a)}X_a \quad (1)$$

$$R^2_2(HO)SiO-(R^2XSiO)_{m+2}-(R^2_2SiO)_n-SiR^2_2(OH) \quad (2)$$

wherein:
each $R^2$ independently represents a monovalent hydrocarbon group not containing an aliphatic unsaturated bond;
each X independently represents an alkenyl-containing monovalent organic group;
character "a" represents an integer of 0 to 3;
2a+m indicates a number giving content of an alkenyl group in a range from 0.75 to 7.5% by mole in a molecule;
character "n" represents a number of 100 or more; and m+n indicates a number giving a polydiorganosiloxane represented by any one of the general formula (1) and formula (2) or both having a viscosity of 10,000 mPa·s or more at 25° C.

9. The method for manufacturing the lamination type semiconductor integrated device according to claim 6, wherein Component (A) in the pressure-sensitive silicone adhesive is a diorganopolysiloxane represented by any one of the following general formula (1) and formula (2) or both:

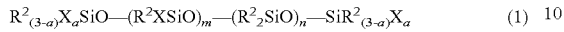 (1)

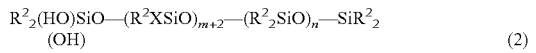 (2)

wherein:
each $R^2$ independently represents a monovalent hydrocarbon group not containing an aliphatic unsaturated bond;
each X independently represents an alkenyl-containing monovalent organic group;
character "a" represents an integer of 0 to 3;
2a+m indicates a number giving content of an alkenyl group in a range from 0.75 to 7.5% by mole in a molecule;
character "n" represents a number of 100 or more; and
m+n indicates a number giving a polydiorganosiloxane represented by any one of the general formula (1) and formula (2) or both having a viscosity of 10,000 mPa·s or more at 25° C.

10. The method for manufacturing the lamination type semiconductor integrated device according to claim 1, wherein the pressure-sensitive silicone adhesive is in a form of a liquid, and after the pressure-sensitive silicone adhesive is applied onto any one of the support substrate for processing and the surface of the first semiconductor wafer upon which the device is formed or both and then cured, the support substrate for processing is bonded to the surface of the first semiconductor wafer upon which the device is formed.

11. The method for manufacturing the lamination type semiconductor integrated device according to claim 9, wherein the pressure-sensitive silicone adhesive is in a form of a liquid, and after the pressure-sensitive silicone adhesive is applied onto any one of the support substrate for processing and the surface of the first semiconductor wafer upon which the device is formed or both and then cured, the support substrate for processing is bonded to the surface of the first semiconductor wafer upon which the device is formed.

12. The method for manufacturing the lamination type semiconductor integrated device according to claim 1, wherein the pressure-sensitive silicone adhesive is in a form of a pressure-sensitive silicone adhesive double coated tape.

13. The method for manufacturing the lamination type semiconductor integrated device according to claim 9, wherein the pressure-sensitive silicone adhesive is in a form of a pressure-sensitive silicone adhesive double coated tape.

14. The method for manufacturing the lamination type semiconductor integrated device according to claim 12, wherein the pressure-sensitive silicone adhesive double coated tape has a heat resistant plastic film as a support substrate coated with a pressure-sensitive silicone adhesive on both sides of the plastic film.

15. The method for manufacturing the lamination type semiconductor integrated device according to claim 13, wherein the pressure-sensitive silicone adhesive double coated tape has a heat resistant plastic film as a support substrate coated with a pressure-sensitive silicone adhesive on both sides of the plastic film.

16. The method for manufacturing the lamination type semiconductor integrated device according to claim 12, wherein an adhesive strength of the pressure-sensitive silicone adhesive double coated tape is higher in an adhesion side to the support substrate for processing than in an adhesion side to the surface of the first semiconductor wafer upon which the device is formed.

17. The method for manufacturing the lamination type semiconductor integrated device according to claim 13, wherein an adhesive strength of the pressure-sensitive silicone adhesive double coated tape is higher in an adhesion side to the support substrate for processing than in an adhesion side to the surface of the first semiconductor wafer upon which the device is formed.

18. The method for manufacturing the lamination type semiconductor integrated device according to claim 14, wherein an adhesive strength of the pressure-sensitive silicone adhesive double coated tape is higher in the adhesion side to the support substrate for processing than in an adhesion side to the surface of the first semiconductor wafer upon which the device is formed.

19. The method for manufacturing the lamination type semiconductor integrated device according to claim 15, wherein an adhesive strength of the pressure-sensitive silicone adhesive double coated tape is higher in an adhesion side to the support substrate for processing than in an adhesion side to the surface of the first semiconductor wafer upon which the device is formed.

20. The method for manufacturing the lamination type semiconductor integrated device according to claim 12, wherein a size of the pressure-sensitive silicone adhesive double coated tape is larger than, partly or totally, that of the support substrate for processing and the first semiconductor wafer to be bonded.

21. The method for manufacturing the lamination type semiconductor integrated device according to claim 13, wherein a size of the pressure-sensitive silicone adhesive double coated tape is larger than, partly or totally, that of the support substrate for processing and the first semiconductor wafer to be bonded.

22. The method for manufacturing the lamination type semiconductor integrated device according to claim 14, wherein a size of the pressure-sensitive silicone adhesive double coated tape is larger than, partly or totally, that of the support substrate for processing and the first semiconductor wafer to be bonded.

23. The method for manufacturing the lamination type semiconductor integrated device according to claim 15, wherein a size of the pressure-sensitive silicone adhesive double coated tape is larger than, partly or totally, that of the support substrate for processing and the first semiconductor wafer to be bonded.

24. The method for manufacturing the lamination type semiconductor integrated device according to claim 16, wherein a size of the pressure-sensitive silicone adhesive double coated tape is larger than, partly or totally, that of the support substrate for processing and the first semiconductor wafer to be bonded.

25. The method for manufacturing the lamination type semiconductor integrated device according to claim 19, wherein a size of the pressure-sensitive silicone adhesive double coated tape is larger than, partly or totally, that of the support substrate for processing and the first semiconductor wafer to be bonded.

* * * * *